United States Patent [19]

Dunsmore

[11] Patent Number: 5,261,243
[45] Date of Patent: Nov. 16, 1993

[54] SUPPLEMENTAL COOLING SYSTEM FOR AVIONIC EQUIPMENT

[75] Inventor: Richard F. Dunsmore, Marietta, Ga.

[73] Assignee: Lockheed Corporation, Calabasas, Calif.

[21] Appl. No.: 951,606

[22] Filed: Sep. 28, 1992

[51] Int. Cl.$^5$ .............................................. F17C 7/02
[52] U.S. Cl. .................... 62/52.1; 62/259.2; 62/223; 62/332
[58] Field of Search ............ 62/223, 332, 259.2, 62/50.2, 52.1

[56] References Cited

U.S. PATENT DOCUMENTS

| | | | |
|---|---|---|---|
| 3,109,296 | 11/1963 | Williamson et al. | 62/52.1 X |
| 4,481,780 | 11/1984 | Delano | 62/50.2 X |
| 5,172,555 | 12/1992 | Schmidtke | 62/50.2 |

*Primary Examiner*—William E. Wayner
*Attorney, Agent, or Firm*—Eric R. Katz

[57] ABSTRACT

A supplemental cooling system is provided for selectively boosting the cooling capacity of a primary cooling system having a cooling duct for feeding cooling air to an electrical device to be cooled. The supplemental cooling system includes a source of cryogenic coolant and a control valve for controlling the amount of cryogenic coolant fed to the cooling duct of the primary cooling system. Also provided is an injection nozzle for injecting the cryogenic coolant into the cooling air duct and a mixer for mixing the cryogenic coolant with the cooling air of the cooling duct so that, as the cryogenic coolant evaporates, the cooling capacity of the primary cooling system is boosted. A controller controls the operation the control valve to regulate the amount of cryogenic coolant released into the cooling duct and thereby set the amount of increased cooling provided.

13 Claims, 1 Drawing Sheet

SUPPLEMENTAL COOLING SYSTEM FOR AVIONIC EQUIPMENT

BACKGROUND OF THE INVENTION

1. Field of the Invention

The present invention generally relates to a supplemental cooling system for use with a primary cooling arrangement for electronic equipment during peak demand periods, and more particularly, to a such supplemental cooling system for improving avionics reliability which provides both weight savings as well as accurate control of the cooling air temperature by introducing controlled amounts of liquid $CO_2$ into a forced air cooling manifold.

2. Background

Reliance on electronic circuitry, i.e., integrated circuits, in aerospace vehicles, such as combat aircraft, has increased dramatically due to the performance improvements and weight savings advantages provided by such technology. Although operationally quite efficient, one disadvantage associated with the use of such electronic circuitry, particularly in connection with avionic equipment, is the technology's dependence on appropriate cooling arrangements for assuring reliable performance of the electronic circuitry.

Examples of known cooling arrangements include forced air cooling, conductive cooling (heat sinks) as well as liquid cooling. Because such cooling systems add weight to the vehicle, they offset the weight savings provided by the use of integrated circuits. Further, these types of cooling systems require constant maintenance, due to the fact that without proper cooling, the degradation in performance of the electronics can be so severe as to threaten the operability of the aircraft, particularly when the electronics are employed as avionics. Moreover, the need for a reliable cooling system increases the overall cost of production of the vehicle.

In addition, the demand on the cooling system to provide an adequate level of cooling varies in dependence on the operational circumstances of the aircraft. For example, there is typically a high demand for cooling of the electronic equipment during the time that the aircraft is on the ground whereas during flight, where temperatures are reduced due to altitude, the cooling requirements of the system are correspondingly reduced.

In order to satisfy such peak demand requirements, cooling systems are typically employed that have a much great cooling capacity than is needed for vast majority of the operational time of the aircraft. As a result, weight, cost and performance requirements of the cooling system are exasperated.

SUMMARY OF THE INVENTION

Accordingly, it is an object of the present invention to provide a supplemental cooling system which permits the use of a relatively inexpensive and light weight primary cooling system.

Another object of the present invention is to provide a supplemental cooling system which, in combination with the use of the primary cooling system, improves maintainability of the overall arrangement due to the simplicity of the hardware employed by the supplemental cooling system.

Yet another object of the present invention is to provide a supplemental cooling system for improving avionic reliability through accurate control of the cooling air temperature by introducing controlled amounts of liquid $CO_2$ into a forced air cooling manifold.

One advantageous feature of preferred embodiments of the present invention is that the supplemental cooling system permits the use of a primary cooling arrangement which need not have a peak performance level sufficient to meet all peak cooling demand requirements, thereby resulting in an overall reduction in cost, bulk, weight.

Other advantageous features of preferred embodiments of the present invention include reduced air flow, easy adaption and retrofit to existing cooling arrangements, and minimal coolant usage. Additionally, the coolant use by the supplemental cooling system, i.e., carbon dioxide, is readily available, requires no special venting and has a minimal effect on the conditioned environment. Further, the supplemental cooling system obviates the requirement to dump heated air as is normally required by a refrigerant cycle and further reduces vulnerability of the aircraft to battle damage.

These and other objects, advantages and features are achieved by the supplemental cooling system of the present invention, which, according to one embodiment thereof, comprises a source of cryogenic coolant and a control valve for controlling the amount of cryogenic coolant fed to the cooling duct of the primary cooling system. Also provided is an injection nozzle for injecting and mixing the cryogenic coolant with the cooling air of the cooling duct so that, as the cryogenic coolant evaporates, the cooling capacity of the primary cooling system is increased. A controller controls the operation the control valve to regulate the amount of cryogenic coolant released into the cooling duct and thereby set the amount of supplemental cooling provided.

According to a further embodiment of the supplemental cooling system of the present invention, an on-board cryogenic coolant generator is included which generates the cryogenic coolant stored by the cryogenic source.

According to yet another embodiment of the present invention, a connection arrangement is provided for connecting an external source of cryogenic coolant to the supplemental cooling system. This arrangement permits the use of the supplemental cooling system while the aircraft is on the ground without the need to use the on-board cryogenic coolant or provides an arrangement where the storage of an on-board cryogenic coolant is eliminated.

DETAILED DESCRIPTION OF THE PREFERRED EMBODIMENT(S)

Figure 1:
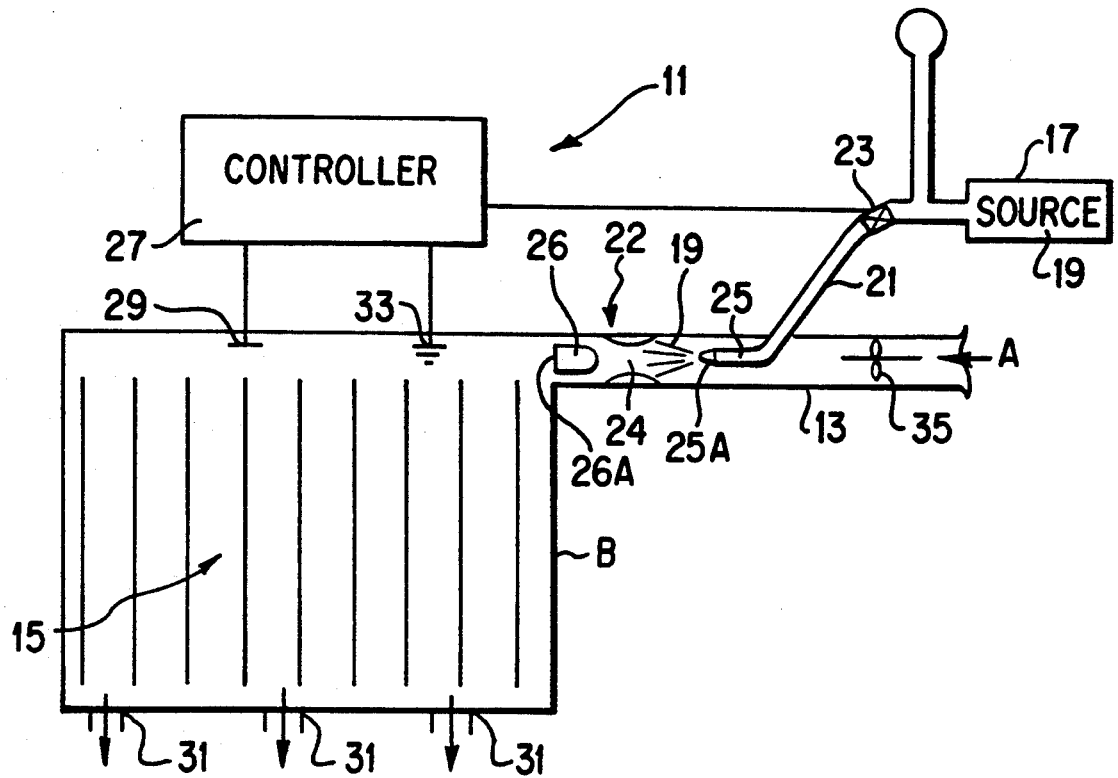
FIG. 1 illustrates one embodiment of the supplemental cooling system of the present invention including the mixing arrangement at the cooling duct of the primary cooling system.

Referring to FIG. 1, one embodiment of the supplemental cooling system, generally shown at 11, is provided for boosting a cooling capacity of a primary cooling system (not shown) having a cooling duct 13 for feeding cooling air A to an electrical device 15 to be cooled, for example, avionics enclosed in a cabinet B. The supplemental cooling system 11 includes a source 17 of cryogenic coolant 19, for example, liquid carbon dioxide, as well as a conduit 21 for feeding the cryogenic coolant 19 to the cooling duct 13 of the primary cooling system.

A control valve 23 is provided for controlling flow of the cryogenic coolant 19 from the source 17 to the cooling duct 13 of the primary cooling system. Additionally, an injection nozzle 25 is included for injecting the cryogenic coolant 19 with the cooling air A of the cooling duct 13 so that, as the cryogenic coolant 17 evaporates, supplemental cooling of the cooling air A is provided. The nozzle 25 preferably includes a tip heater 25A to prevent the formation of ice at the tip of the nozzle 25 or ice particles in the cooling air A by the expanding cryogenic coolant 17. The tip heater 25A is a known device, available commercially from R. G. Hansen & Associates in Santa Barbara, Calif. 93101.

In order to assure adequate mixing of the cryogenic coolant 17 with the cooling air A of the cooling duct 13, a mixing arrangement, generally shown at 22 in FIG. 1, is provided for inducing turbulent flow. Referring to FIG. 1, the mixing arrangement 22 comprises a constriction 24, downstream from the injection nozzle 25 and a bluff body 26 positioned downstream of the constriction 24. The blunt end 26A of the bluff body 26 is preferably positioned away from the direction of flow of the cooling air A.

A controller 27 controls the operation the control valve 25 to regulate the amount of cryogenic coolant 19 released into the cooling duct 13 and thereby set a level of supplemental cooling provided. The controller 27 is connected to a temperature sensor 29 for detecting a temperature of the cooling air A downstream from the injection nozzle 25 in order to determine the amount of cryogenic coolant 19 to be released from the source 17.

After reducing the temperature of the cooling air A, the cryogenic coolant 19 and cooling air A mixture is passed over a dehumidifier or air dryer 33 for removing water and then through the cabinet A and over the electrical device 15 to cool the same. Thereafter, the cryogenic coolant 19 and cooling air A mixture is vented by vents 31. The supplemental cooling system 11 can also include a blower 35 positioned, for example, upstream from the injector 25.

EXAMPLE

One (1) cubic foot of liquid carbon dioxide at 0 degrees C and 300 psi expands to 700 cubic feet of carbon dioxide gas when released at ambient temperature and pressure. Mixed with air at a ratio of 10:1, 1 cubic foot of liquid carbon dioxide can cool 7000 cubic feet of air by approximately 10 degrees C. At a typical requirement of 100 cubic feet per minute of cooling air, the supplemental cooling provided by the expansion of carbon dioxide, set forth above, could be maintained for about seventy (70) minutes.

According to a further embodiment of the supplemental cooling system 11, a connection arrangement 37, as shown in FIG. 1, is provided for connecting an external source (not shown) of cryogenic coolant 19 to the supplemental cooling system 11. This arrangement permits the use of the supplemental cooling system 11 while the aircraft is on the ground without the need to use the on-board source 17 cryogenic coolant 19 or provides an arrangement where the storage of an on-board cryogenic coolant 19 is eliminated all together.

Figure 2:
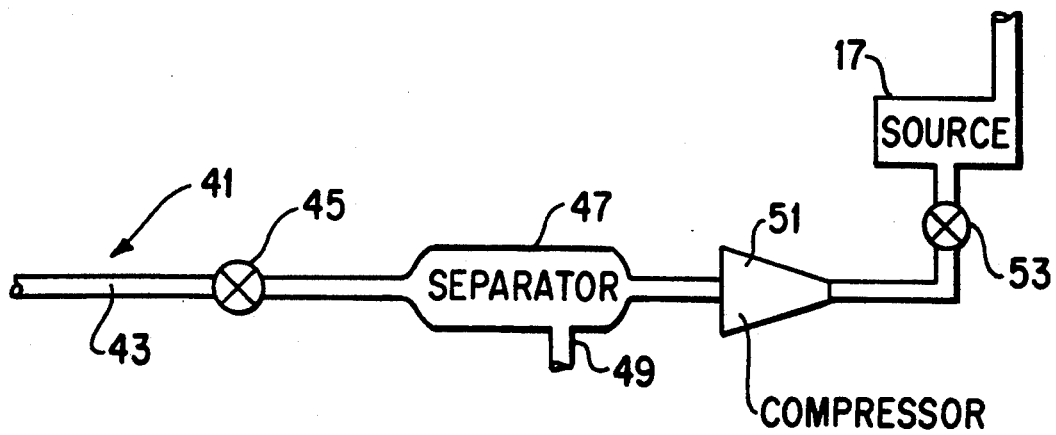
FIG. 2 illustrates a further aspect of the present invention wherein a cryogenic coolant generator is provided.

Referring to FIG. 2, a further aspect of the supplemental cooling system 11, according to yet another embodiment of the present invention, is shown wherein 16 the system 11 further includes a cryogenic coolant supply arrangement, generally indicated at 41. The supply arrangement 41 receives carbon dioxide gas by conduit 43 from, for example, engine exhaust or carbon dioxide generator in the engine nacelle (not shown). The carbon dioxide gas is fed, by way of a one-way valve 45, to a separator 47 where contaminates are vented by vent 49. Pure carbon dioxide is then compressed to liquid form by a compressor 51 and fed to the source 17 by a further one-way valve 53 where it is stored until needed.

Although the present invention has been described with particular reference to its preferred embodiments, it should be understood that many variations and modifications will now be obvious to those skilled in that art, and it is preferred, therefore, that the scope of the invention be limited, not by the specific disclosure herein, but only by the appended claims.

What is claimed is:

1. A supplemental cooling system for boosting a cooling capacity of a primary cooling system having a cooling duct for feeding cooling air to a device to be cooled, the supplemental cooling system comprising:

a source of cryogenic coolant;

a conduit for feeding the cryogenic coolant to the cooling duct of the primary cooling system;

a control valve for controlling flow of the cryogenic coolant from the source to the cooling duct of the primary cooling system;

an injection nozzle for injecting the cryogenic coolant into the cooling duct of the primary cooling system;

a mixer for mixing the cryogenic coolant with the cooling air of the cooling duct so that, as the cryogenic coolant evaporates, supplemental cooling of the cooling air is provided; and a controller for controlling the operation the control valve to regulate the amount of cryogenic coolant released into the cooling duct and thereby set a level of supplemental cooling provided.

2. A system according to claim 1, wherein the nozzle includes a heater for preventing the formation of ice at the injection nozzle.

3. A system according to claim 1, wherein the controller includes a temperature sensor for detecting a temperature of the cooling air downstream from the injection nozzle.

4. A system according to claim 1, further comprising air dryer means for removing water from the cooling air.

5. A system according to claim 4, wherein the air dryer means is positioned downstream of the injection nozzle.

6. A system according to claim 1, wherein the cryogenic coolant is liquid carbon dioxide.

7. A system according to claim 1, further comprising a cryogenic coolant generator for generating the cryogenic coolant stored by the source of cryogenic coolant.

8. A system according to claim 1, further comprising a connection arrangement for connecting an external source of cryogenic coolant to the supplemental cooling system.

9. A supplemental cooling system for boosting a cooling capacity of a primary cooling system of an aircraft having a cooling duct for feeding cooling air to a device to be cooled, the supplemental cooling system comprising:

a connection arrangement for connecting a source of cryogenic coolant, external to the aircraft, to the supplemental cooling system;

a conduit for feeding the cryogenic coolant to the cooling duct of the primary cooling system;

a control valve for controlling flow of the cryogenic coolant from the source to the cooling duct of the primary cooling system;

an injection nozzle for injecting the cryogenic coolant into the cooling duct of the primary cooling system;

a mixer for mixing the cryogenic coolant with the cooling air of the cooling duct so that, as the cryogenic coolant evaporates, supplemental cooling is provided; and a controller for controlling the operation the control valve to regulation amount of cryogenic coolant released into the cooling duct and thereby set the amount of supplemental cooling provided.

10. A system according to claim 9, wherein the nozzle includes a heater for preventing the formation of ice at the injection nozzle.

11. A system according to claim 9, wherein the controller includes a temperature sensor for detecting a temperature of the cooling air downstream from the injection nozzle.

12. A system according to claim 9, further comprising air dryer means for removing water from the cooling air.

13. A system according to claim 12, wherein the air dryer means is positioned downstream of the injection nozzle.

* * * * *